United States Patent
Okuyama

(10) Patent No.: US 6,445,593 B1
(45) Date of Patent: Sep. 3, 2002

(54) CHIP ELECTRONIC COMPONENT AND METHOD OF MANUFACTURING THE SAME

(75) Inventor: Shingo Okuyama, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/642,304

(22) Filed: Aug. 21, 2000

(30) Foreign Application Priority Data

Aug. 19, 1999 (JP) .......................................... 11-232392

(51) Int. Cl.$^7$ ................................................ H05K 1/16
(52) U.S. Cl. ....................... 361/765; 361/763; 361/764; 361/773; 257/421; 257/531; 336/200
(58) Field of Search ................................. 361/765, 766, 361/767, 768, 769, 770, 772, 774, 777, 780, 782, 321, 763, 764; 336/200; 257/531, 414, 421

(56) References Cited

U.S. PATENT DOCUMENTS

| 3,694,710 A | * | 9/1972 | Kirschner | .................... 361/321 |
| 4,356,529 A | * | 10/1982 | Kopel | ........................ 361/304 |
| 4,845,452 A | * | 7/1989 | Sasaki et al. | ............... 336/200 |

FOREIGN PATENT DOCUMENTS

| JP | 63-46384 | 3/1988 |
| JP | 2-256225 | 10/1990 |
| JP | 3-62917 | 3/1991 |
| JP | 6-14506 | 2/1994 |
| JP | 8-279723 | 10/1996 |
| JP | 10-22183 | 1/1998 |
| JP | 10-59346 | 3/1998 |
| JP | 10-172832 | 6/1998 |
| JP | 10-322157 | 12/1998 |
| JP | 11-45837 | 2/1999 |
| JP | 11-67554 | 3/1999 |

* cited by examiner

Primary Examiner—David S. Martin
Assistant Examiner—Hung Bui
(74) Attorney, Agent, or Firm—Keating & Bennett, LLP

(57) ABSTRACT

A chip type electronic component and a method of manufacturing the same reduces the steps necessary for applying an electrically conductive paste to define a first external electrode, a second external electrode and a third external electrode on the outer surface of an electronic component main body. External electrodes are provided around the side surfaces of the main body of the electronic component. The first external electrode is positioned on the first end surface of the main body, the second external electrode is positioned on the second end surface, the third external electrode is positioned between the first and second external electrodes. The first and second external electrodes are arranged to extend to edge portions of the first and second end surfaces, but exposing at least the approximate central portions of these end surfaces. In this way, the external electrodes are formed by applying the electrically conductive paste on the side surfaces of the main body.

15 Claims, 7 Drawing Sheets

CHIP ELECTRONIC COMPONENT AND METHOD OF MANUFACTURING THE SAME

BACKGROUND OF THE INVENTION

1. Field of the Invention

The present invention relates to a chip-like electronic component and a method of manufacturing the same. More particularly, the present invention relates to an improvement in forming external electrodes in a chip-like electronic component.

2. Description of the Related Art

FIG. 11 is a perspective view schematically showing an outer appearance of a chip-like electronic component 1, on the basis of which the present invention has been developed. A chip-like electronic component having three terminals and having an outer appearance as shown in FIG. 11 has been known. This type of an electronic component includes, for example, a chip-like coil, a three-terminal capacitor, a capacitor array, an LC filter and a capacitor network.

The chip-like electronic component 1 includes an element main body 2. Such an element main body 2 includes a first end surface 3 and a second end surface 4 on the opposite end of the main body 2. The element main body 2 further includes a first side surface 5, a second side surface 6, a third side surface 7 and a fourth side surface 8, all of which are connected to the first end surface 3 and the second end surface 4.

Further, on the outer surface of the element main body 2 a first external electrode 9, a second external electrode 10 and a third external electrode 11 are provided. The first external electrode 9, the second external electrode 10 and the third external electrode 11 are arranged such that they surround the first side surface 5, the second side surface 6, the third side surface 7 and the fourth side surface 8.

The first external electrode 9 is positioned on the first end surface 3 of the element main body 2, and is arranged such that the first end surface 3 is entirely covered by the first external electrode 9. The second external electrode 10 is positioned on the second end surface 4 of the element main body 2, and is configured such that the second end surface 4 is entirely covered by the second external electrode 10. Further, the third external electrode 11 is positioned between the first external electrode 9 and the second external electrode 10.

The above described external electrodes 9 to 11 are formed by applying an electrically conductive paste on the element main body 2, drying and sintering the applied paste. However, a method of applying the electrically conductive paste for defining the external electrodes 9 to 11 may be carried out in the following way.

First, a process for forming the first external electrode 9 may be conducted in a manner shown in FIG. 12. An electrically conductive paste layer 13 having a desired thickness is formed in a dip tray 12. Then, a main body 2 is dipped into the electrically conductive paste layer 13, moved in a direction shown by an arrow 14, with the first end surface 3 facing downwardly towards the electrically conductive paste layer 13, followed by moving the element main body 2 upwardly away from the paste layer 13. In this way, the electrically conductive paste 13 may be applied to the first end surface 3 of the element main body 2, and to a portion of each of the adjacent side surfaces 5 to 8, so as to form the first external electrode 9.

Next, an operation similar to that described above is carried out on the second end surface 4 of the element main body 2. In this way, the electrically conductive paste 13 may be applied to the second end surface 4 of the element main body 2, and to a portion of each of the adjacent side surfaces 5 to 8, so as to form the second external electrode 10.

Subsequently, in order to form the third external electrode 11, a process shown in FIG. 13 is carried out. In this process, a slit plate 15 is used. Such a slit plate 15 is provided with a plurality of slits 16 each having a width corresponding to the width of the third external electrode 11. The slit plate 15 is disposed so as to close an upper opening of a paste tank 17 containing an amount of an electrically conductive paste 13. Moreover, a cylinder 18 is arranged to communicate with the internal space of the paste tank 17. A piston 19 is provided within the cylinder 18.

A plurality of element main bodies 2 are arranged such that the first side surface 5 of each element main body comes into contact with the slit plate 15. Then, the piston 19 is displaced in a direction shown by an arrow 20, so that the electrically conductive paste 13 flows through the plurality of the slits 16 so as to be supplied to the upper surface of the slit plate 15. As a result, the electrically conductive paste 13 may be applied to the middle (in the longitudinal direction) of the first side surface 5 of each element main body 2.

Similar operations are then carried out successively on the second to fourth side surfaces 6 to 8 of each element main body 2.

Additionally, rather than using a process shown in FIG. 13, a process shown in FIG. 14 may also be used. In the process shown in FIG. 14, a paste application plate 21 is used and is formed of an elastomeric material capable of elastically deforming in a manner similar to rubber. The paste applying plate 21 is provided with a plurality of grooves each having a width corresponding to the width of the third external electrode 11. Each of the grooves 22 is filled with the electrically conductive paste 13.

Then, each element main body 2 is pressed on the paste applying plate 21 with its first side surface 5 in contact with the paste applying plate 21. In this way, each element main body 2 will cause the paste applying plate 21 to be compressed so as to deform in its thickness direction. As a result, the electrically conductive paste 13 contained in each groove 22 is applied to the middle (in the longitudinal direction) of the first side surface 5 of each element main body 2.

Similar operations are then carried out successively on the second to fourth side surfaces 6 to 8 of each element main body 2.

However, in order to manufacture the chip-like electronic component shown in FIG. 11, because it is necessary to form the first, second and third electronic electrodes 9, 10 and 11 on the element main body 2, it is necessary to carry out several different processes as shown in FIG. 12 and FIG. 13 or FIG. 14. Further, because the process shown in FIG. 12 has to be carried out successively on the first and second end surfaces 3 and 4, i.e., because the same process has to be carried out twice, the entire production process of manufacturing the chip-like electronic component is excessively complicated. Moreover, since the process shown in FIG. 13 or the process shown in FIG. 14 has to be carried out on the first to fourth side surfaces 5 to 8, the same process has to be carried out four times in total, hence making the entire production process of manufacturing the chip-like electronic component excessively complex.

In view of the above, because many steps are required in applying the electrically conductive paste to an element main body to produce the external electrodes 9 to 11, the production cost for manufacturing the chip-like electronic component 1 is excessively high. For this reason, there has been a demand to reduce the number of steps in applying the electrically conductive paste 13.

SUMMARY OF THE INVENTION

In order to overcome the above-described problems, preferred embodiments of the present invention provide an improved chip-like electronic component and an improved method of manufacturing the same.

Preferred embodiments of the present invention improve the external electrodes of a chip-like electronic component, thereby solving the above discussed problems.

Preferred embodiments of the present invention provide a chip-like electronic component including a chip-like element main body having a first end surface and a second end surface which are opposite to each other, a first side surface, a second side surface, a third side surface and a fourth side surface, all of which are connected between the first end surface and the second end surface, external electrodes provided on the outer surface of the chip-like element main body, wherein the external electrodes are provided on at least the first side surface, the external electrodes including a first external electrode provided on the first end surface side, a second external electrode provided on the second end surface side, a third external electrode provided between the first external electrode and the second external electrode. The chip-like electronic component of preferred embodiments of the present invention includes the following arrangement.

The first external electrode, the second external electrode and the third external electrode are arranged to extend to other surfaces adjacent to the first side surface, the first external electrode and the second external electrode are configured such that the first end surface and the second end surface are exposed at least at approximate central portions thereof.

With the chip-like electronic component of preferred embodiments of the present invention, areas for the external electrodes to be provided on an element main body may be optionally changed. The external electrodes may also be provided only on the first side surface, or further on the third side surface opposite to the first side surface. Moreover, the external electrodes may be provided on the second side surface and on the fourth side surface. In this way, the external electrodes extend around the first, second, third and fourth side surfaces.

Further, aspects of preferred embodiments of the present invention may be employed in various types of chip-like electronic components. For example, preferred embodiments of the present invention are directed to an LC composite electronic component including a chip-like element main body includes a first inductor and a second inductor which are connected in series with each other between the first external electrode and the second external electrode, further including a capacitor having one capacitor electrode connected to the third external electrode and another capacitor electrode connected to an approximate middle point between the first inductor and the second inductor.

Moreover, when the chip-like electronic component according to preferred embodiments of the present invention is an LC composite electronic component as described above, it preferably has the following configuration.

The chip-like element main body has a laminated structure provided by a plurality of electrically insulating layers laminated in the longitudinal direction of the element main body so as to connect between the first end surface and the second end surface. The first inductor is disposed in the vicinity of the first end surface, which is located in a one third portion of the chip-like element main body in the longitudinal direction, the second inductor is disposed in the vicinity of the second end surface, the capacitor is disposed in an approximate central portion of the chip-like element main body.

The first inductor and the second inductor are provided by coil conductors arranged among the electrically insulating layers and via-hole conductors provided through the electrically insulating layers, such that the two inductors extend in a coiled configuration with the axial direction thereof being coincident with the longitudinal direction of the chip-like element main body. The capacitor electrodes constituting the capacitor are provided among the electrically insulating layers.

Additionally, other preferred embodiments of the present invention are directed to a method of manufacturing a chip-like electronic component described above. The manufacturing method includes the following processes.

First, a plurality of element main bodies is prepared.

Then, a slit plate having a first main surface and a second main surface which are opposite to each other with a predetermined interval therebetween is provided, and having first, second and third slits capable of passing an electrically conductive paste so as to apply the paste to any of the side surfaces of each element main body to form a first external electrode, a second external electrode and a third external electrode on each element main body. The application of the paste being performed under a condition in which each element main body is placed on to the slit plate such that any one of the first to fourth side surfaces of an element main body is in contact with the first main surface of the slit plate.

Subsequently, a step of placing each element main body on the first main surface of the slit plate such that any one of the side surfaces of each element main body surfaces the first main surface of the slit plate is performed.

Afterwards, a step of supplying the electrically conductive paste so as to flow through the first, second and third slits to the first main surface of the slit plate, so as to apply the electrically conductive paste to any one of the side surfaces of each element main body is performed.

More particularly, the method of manufacturing a chip-like electronic component according to preferred embodiments of the present invention is carried out in the following way.

The step of preparing the slit plate includes placing a closing plate having a resilient member which is capable of contacting the second main surface of the slit plate so as to close the first, second and third slits, preparing a pressing plate capable of pressing the closing plate so as to cause the closing plate to elastically deform towards the first, second and third slits, and filling the first, second and third slits with the electrically conductive paste. Further, the step of applying the electrically conductive paste includes pressing the closing plate by the pressing plate, so as to cause the closing plate to elastically deform towards the first, second and third slits, thereby causing the electrically conductive paste filled in the first, second and third slits to flow onto the first main surface of the slit plate, thus enabling the electrically conductive paste in the first, second and third slits to be applied to any one of the side surfaces of each element main body.

Other features, characteristics, elements and advantages of the present invention will become apparent from the following description of preferred embodiments thereof with reference to the attached drawings.

DETAILED DESCRIPTION OF PREFERRED EMBODIMENTS

Figure 1:
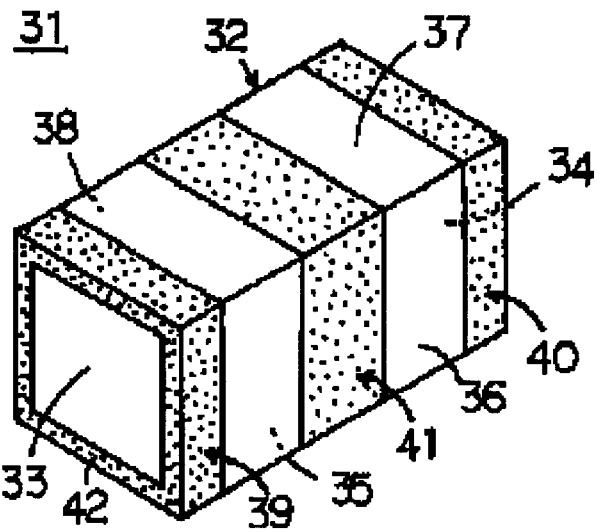
FIG. 1 is a perspective view schematically showing an outer appearance of a chip-like electronic component made according to one preferred embodiment of the present invention.

FIG. 1 is a perspective view schematically showing an outer appearance of a chip-like electronic component 31 according to one preferred embodiment of the present invention.

The chip-like electronic component 31 preferably includes a chip-like element main body 32. The element main body 32 includes a first end surface 33 and a second end surface 34 which are arranged opposite to each other, a first side surface 35, a second side surface 36, a third side surface 37 and a fourth side surface 38, all of which are connected with the first end surface 33 and the second end surface 34.

Further, on the outer surface of the element main body 32 a first external electrode 39, a second external electrode 40 and a third external electrode 41 are provided. The first external electrode 39, the second external electrode 40 and the third external electrode 41 extend to surround the first side surface 35, the second side surface 36, the third side surface 37 and the fourth side surface 38.

The first external electrode 39 is located on the first end surface 33 of the element main body 32. The second external electrode 40 is located on the second end surface 34 of the element main body 32. Further, the third external electrode 41 is located between the first external electrode 39 and the second external electrode 40.

Here, the first external electrode 39 includes an adjacent surface extended portion 42 extending around the periphery edge portion of the first end surface 33 that is adjacent to the side surfaces 35 to 38, with the approximate central portion of the first end surface 33 being exposed. Further, although not shown in the drawing, the second external electrode 40 includes an adjacent surface extended portion extending around the periphery edge portion of the second end surface 34 which is adjacent to the side surfaces 35 to 38, with the approximate central portion of the second end surface 34 being exposed in a similar manner as with the first end surface.

Figure 2:
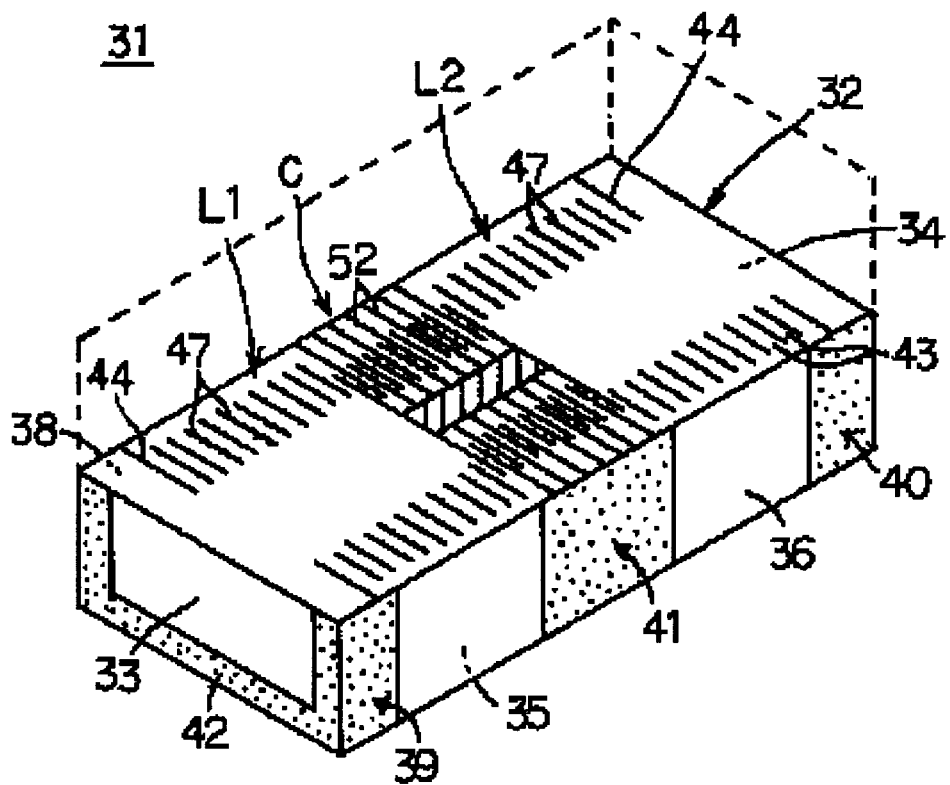
FIG. 2 is an enlarged and partially broken perspective view schematically showing an internal structure of an element main body for use in forming the chip-like electronic component shown in FIG. 1.
Figure 3:
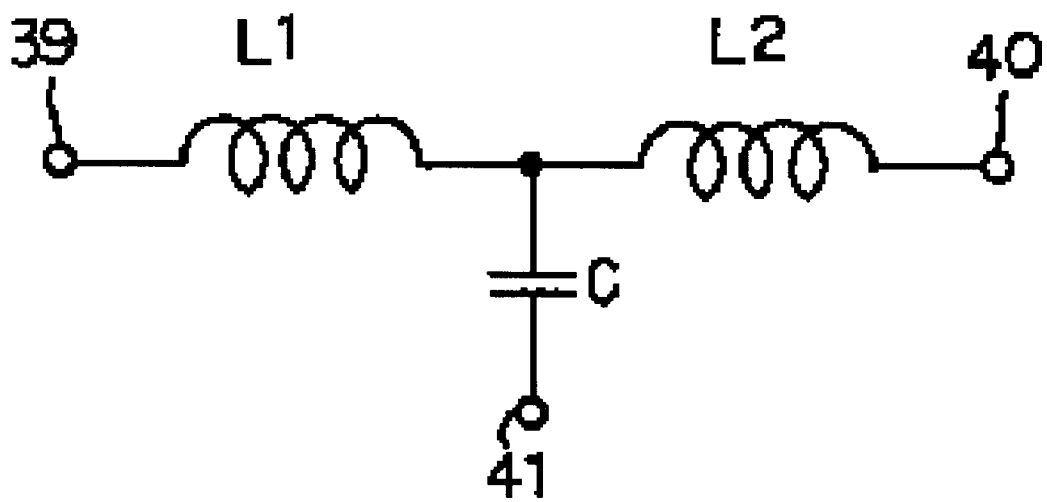
FIG. 3 is a diagram showing an equivalent circuit provided by the chip-like electronic component shown in FIG. 1.

FIG. 2 is a partially broken and partially enlarged perspective view showing in detail the internal structure of the element main body 32 which forms the chip-like electronic component 31 shown in FIG. 1. FIG. 3 is a diagram showing an equivalent circuit provided by the chip-like electronic component 31.

As shown in FIG. 3, the chip-like electronic component 31 is constructed as an LC composite electronic component, including a first inductor L1 and a second inductor L2 which are connected in series with each other between the first external electrode 39 and the second external electrode 40, also including a capacitor C connected between the third external electrode 41 on one end, and a middle portion between the first inductor L1 and the second inductor L2 on the other. In practice, the first inductor L1 and the second inductor L2 and the capacitor C are contained within the element main body 32, as shown in FIG. 2.

In addition, the element main body 32 has a laminated structure including a plurality of electrically insulating layers 43 including an insulating material such as a ceramic, or other suitable material, laminated in the longitudinal direction so as to connect between the first end surface 33 and the second end surface 34. The first inductor L1 is located in a position close to the first end surface 33, the second inductor L2 is located in a position close to the second end surface 34, the capacitor C is located in an approximate central position, with each of them located in a one third portion of the entire element main body in the longitudinal direction thereof.

FIGS. 4 to 7 are explanatory views schematically showing some typical electrically conductive elements that are provided in relation to the above described insulating layers 43.

Figure 4:
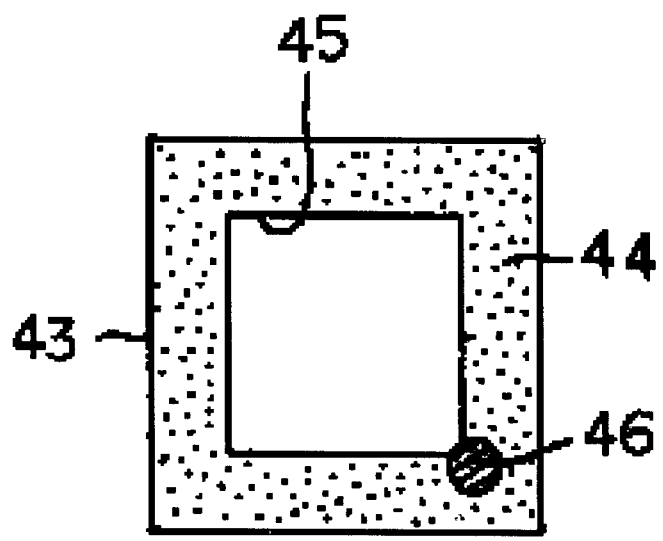
FIG. 4 is a plan view schematically showing an electrically insulating layer provided with a leading conductor shown in FIG. 2.

FIG. 4 is an explanatory view which is used to illustrate a leading conductor 44. As shown in FIG. 2, the leading conductor 44 is positioned in the vicinity of the first end surface 33 or the second end surface 34 of the element main body 32, and extends to the edges of the insulating layers 43 so as to be connected to the first external electrode 39 or the second external electrode 40. Further, the leading conductor 44 is not provided in the approximate central portion thereof, thereby forming a window 45.

Moreover, illustrated in FIG. 4 is also a via-hole conductor 46 provided through the electrically insulating layers 43.

Here, the leading conductor 44 is connected through the via-hole conductor 46 to the ends of coil conductors 47 which will be described later.

Figure 5:
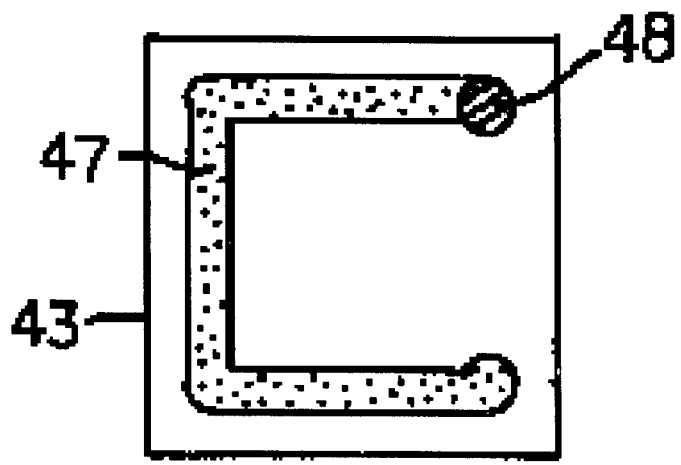
FIG. 5 is a plane view schematically showing an electrically insulating layer provided with a coil conductor shown in FIG. 2.

FIG. 5 is another explanatory view that illustrates one of the coil conductors 47 defining the first inductor L1 or the second inductor L2, and also to illustrate a via-hole conductor 48 extending through the electrically insulating layers 43. Each coil conductor 47 has a substantially U-shaped configuration. A plurality of the coil conductors 47 are disposed between a plurality of the insulating layers 43, and each of the coil conductors 47 is arranged such that they are rotated in sequence by about 90 degrees. In this way, a plurality of coil conductors 47 are connected with one another through the via-hole conductors 48, thereby defining a coil-like structure. An axial direction of the coil-like structure is coincident with a longitudinal direction of the element main body 32 that connects the first end surface 33 and the second end surface 34.

Figure 6:
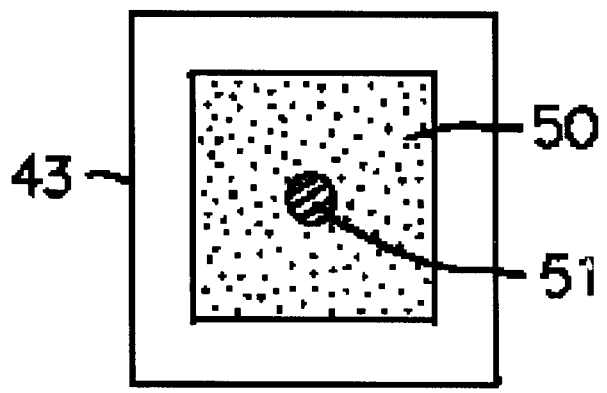
FIG. 6 is a plane view schematically showing an electrically insulating layer provided with a capacitor electrode shown in FIG. 2.

FIG. 6 is a further explanatory view illustrating one capacitor electrode 50 of the capacitor C. The capacitor electrode 50 is arranged such that its outer edge is located inwardly of the outer edge of the insulating layers 43. A plurality of capacitor electrodes 50 which are connected with one another through via-hole conductors 51 passing through the insulating layers 43 are provided, as shown in FIG. 2.

Among the plurality of capacitor electrodes 50, capacitor electrodes 50 located on both ends of each element main body are connected through other via-hole conductors (not shown) to one coil conductor 47 which is located closer to the capacitor C than any other coil conductors 47 defining the first inductor L1 or the second inductor L2.

Figure 7:
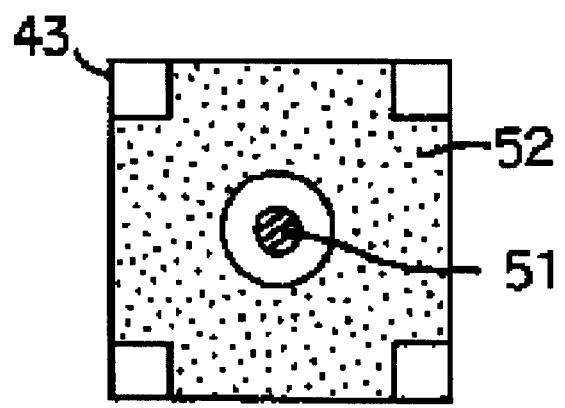
FIG. 7 is a plane view schematically showing an electrically insulating layer provided with a capacitor electrode shown in FIG. 2.

FIG. 7 is a further explanatory view that illustrates the other capacitor electrode 52 of the capacitor C and the via-hole conductor 51 already shown in FIG. 6. Here, the capacitor electrode 52 is arranged such that it extends to the outer edges of the electrically insulating layers 43, and is connected with the third external electrode 41. A plurality of capacitor electrodes 52 are arranged to be connected with one another by the third external electrodes 41, as shown in FIG. 2. The capacitor electrode 52 and the via-hole conductor 51 are arranged such that they are electrically insulated from each other.

These capacitor electrodes 50 and 52 are respectively located among the plurality of electrically insulating layers 43, as shown in FIG. 2. They are arranged alternately with one another, between which the insulating layers 43 are located to produce electrostatic capacitance.

In this way, a chip-like electronic component 31 constitutes an LC composite electronic component including two inductors L1, L2 and one capacitor C as shown in FIG. 3.

The chip-like electronic component 31 of the above configuration is mounted on an electrically conductive land on a circuit board (not shown), by soldering the first external electrode 39, the second external electrode 40 and the third external electrode 41.

In the above described mounting condition, regarding the first external electrode 39 and the second external electrode 40, each of the first end surface 33 and the second end surface 34 is configured such that the approximate central portion thereof is exposed. Although the solder does not reach the approximate central portions, because the adjacent surface extending portion 42 is provided, it still provides a sufficiently reliable mounting condition, when the solder reaches the adjacent surface extending portion 42. In other words, in order to ensure a sufficiently reliable mounting condition, it is not necessary to provide the first external electrode 39 on the approximate central portion of the first end surface 33, and further it not necessary to provide the second external electrode 40 on the approximate central portion of the second end surface 34.

Further, as in the above preferred embodiment involving the chip-like electronic component 31, when the first inductor L1 and the second inductor L2 are configured in a coiled configuration with their axial lines arranged in the longitudinal direction of the element main body, a magnetic field generated by the first inductor L1 and the second inductor L2 will pass through the first end surface 33 and the second end surface 34. However, since the first external electrode 39 and the second external electrode 40 are not provided in the approximate central portions of the first end surface and the second end surface which allows the passing of the magnetic flux of the magnetic field, an improved inductance is attained for the chip-like electronic component. Further, in the present preferred embodiment, in order to avoid blocking the passing of the magnetic flux of the magnetic field, the window 45 has been provided in the leading conductor 44, as shown in FIG. 4.

On the other hand, when a shielding property is desired, and thus, the first external electrode 39 and the second external electrode 40 are not provided with the approximately central portions of the first and second end surfaces 33 and 34 exposed, it is possible to provide an electrically conductive film to cover the entire area of the main surface of the electrically insulating layer 43 which is located in the vicinity of each of the first end surface 33 and the second end surface 34. At this time, if the leading conductor 44 shown in FIG. 4 is modified to cover the entire area of the main surface of the electrically insulating layer 43, it is possible to obtain the function of the conductive film as described above by the modified leading conductor 44. Moreover, the above mentioned electrically conductive film arranged to cover the entire main area of an electrically insulating layer 43, may also be provided on each of the first end surface 33 and the second end surface 34.

Figure 8:
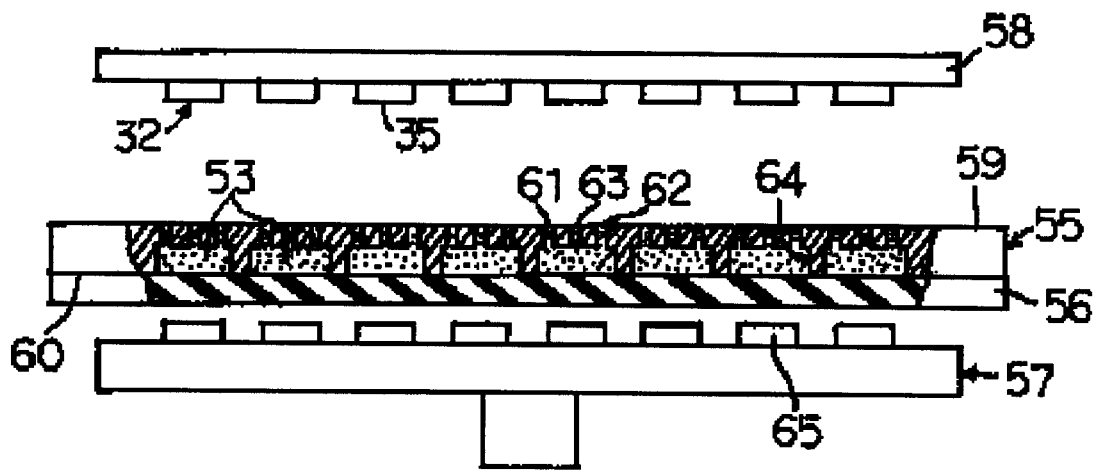
FIG. 8 is a partially sectional front view schematically showing a basic structure of a paste application apparatus for applying an electrically conductive paste in order to form the external electrodes of the chip-like electronic component shown in FIG. 1.
Figure 9:
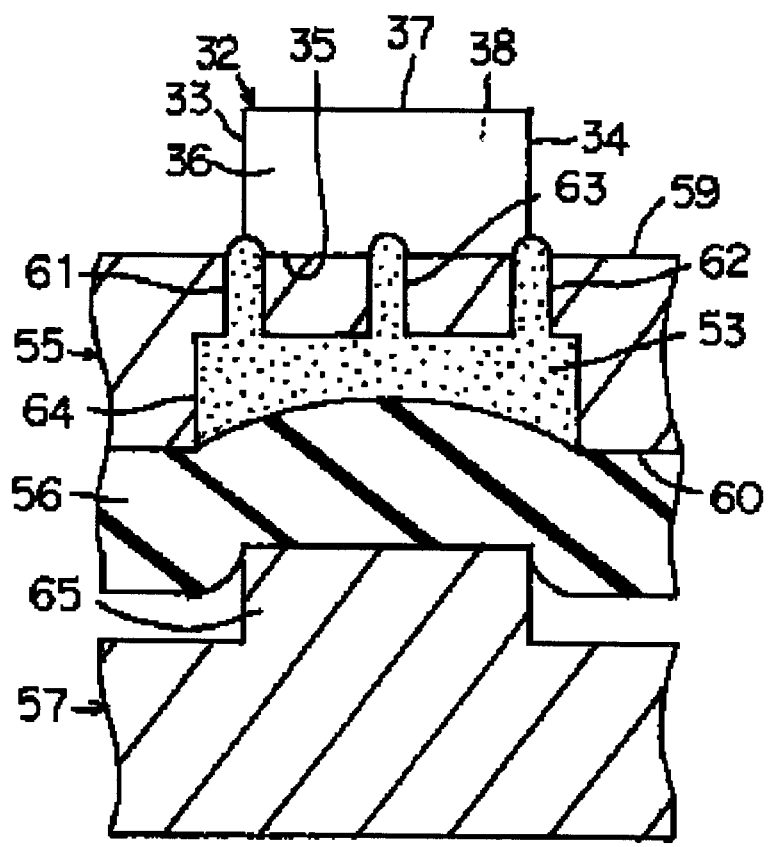
FIG. 9 is an enlarged cross-sectional view schematically showing a portion of the paste application apparatus shown in FIG. 8.

FIG. 8 and FIG. 9 are views that illustrate how the first to third external electrodes 39 to 41 can be provided on the outer surface of the main body 32 of a chip-like electronic component 31, thereby illustrating a preferred method for applying an electrically conductive paste. In detail, FIG. 8 is used to illustrate a basic structure of a paste application apparatus 54 for applying an electrically conductive paste 53, FIG. 9 is a view showing the paste application apparatus 54.

The paste application apparatus 54 includes a slit plate 55, a closing plate 56 and a pressing plate 57. A plurality of element main bodies 32 are held by a holder 58.

The slit plate 55 has a first main surface 59 and a second main surface 60, arranged opposite to each other with a desired interval provided therebetween. As shown in FIG. 9, the first main surface 59 of the slit plate 55 is used to mount a plurality of element main bodies 32.

Further, the slit plate 55 is provided with several groups of slits, with each group including a first slit 61, a second slit 62 and a third slit 63, all of which are adapted to be filled with the electrically conductive paste 53, so that the slits allow the passing of the paste which is applied to any of the side surfaces 35 to 38 of each element main body 32, so as to provide the first external electrode 39, the second external electrode 40 and the third external electrode 41 on each element main body 32. In particular, the slits 61 to 63 are at first filled with the electrically conductive paste 53 and then allow the passing of the paste. Thus, the slits 61 to 63 of each group are located in positions on the slit plate 55, with these positions corresponding to the desired areas (to which the electrically conductive paste 53 should be applied) on the element main body 32.

In this way, the slit plate 55 has a plurality of slit groups each including a first slit 61, a second slit 62 and a third slit 63. Further, in order for the internal spaces of the slits 61 to 63 can be communicated with one another, a plurality of cavities 64 are provided in the slit plate 55 on the side of the second main surface 60.

The slit plate 55 may be made of a rigid material such as an iron material, for example, stainless steel, or may be made of another rigid material such as a ceramic, or other suitable material. Further, the slit plate 55 may either be configured in an integral structure as shown, or configured in a two-part structure. It may be obtained by at first separately preparing one portion having slits 61 to 63 and another portion having cavities 64, and then bonding the two portions together.

The closing plate 56 is arranged to close the slits 61 to 63, particularly to close the cavities 64 on the second main surface 60 of the slit plate. Such a closing plate 56 includes a resilient member such as a silicon rubber, or other suitable material, having a thickness of about 5 mm or less, preferably about 1 mm. The closing plate 56 is then tightly bonded to the slit plate 55 to form an integral body.

Rather than using the above mentioned silicon rubber, the closing plate 56 may also be made of a resin film, or any kind of elastic material, provided that it is capable of elastically deforming upon being pressed by a pressing force from below, and capable of returning to its original shape upon removal of the pressing force.

The pressing plate 57 is arranged to press the closing plate 56 into the slits 61 to 63, particularly into the cavities 64, so that the closing plate 56 is elastically deformed. Thereby the closing plate 56 causes the electrically conductive paste 53 filled in the slits 61 to 63 to flow onto the first main surface 59 of the slit plate 55, so that the paste 53 may be applied to any of the side surfaces 35 to 38 of each element main body 32. The pressing plate 57 is located below the closing plate 56 such that it moves towards the slit plate 55 and the closing plate 56 by a driving member (not shown). The pressing plate 57 may also be made of a rigid material such as a metal or a ceramic, or other suitable material.

In addition, the pressing member 57 is provided with a plurality of projections 65 located in positions corresponding to the cavities 64 provided in the slit plate 55. In the present preferred embodiment, each projection 65 has a width that is smaller than that of the cavity 64.

Next, a method of applying the electrically conductive paste 53 to the element bodies 32 will be described with reference to FIG. 8 and FIG. 9.

Initially, the first to third slits 61 to 63 and the cavities 64 are filled with the electrically conductive paste 53. A preferred filling method will be described later in the present specification.

Then, a plurality of element main bodies 32 held by the holder 58 are placed on the first main surface 59 of the slit plate 55. The first side surface 35 of each element main body 32 is caused to face the first main surface 59 of the slit plate 55. Preferably, the first side surface 35 of each element main body 32 is placed in contact with the first main surface 59 of the slit plate 55. However, since each of the slits 61 to 63 defines an elongated planar shape, the plurality of element main bodies 32 are arranged along the longitudinal direction of the slits 61 to 63 and in parallel with a predetermined interval to each other. The plurality of the element main bodies 32 may be allowed to be arranged with their longitudinal axes perpendicular to the longitudinal direction of the slits 61 to 63. The following processes will be carried out to treat the plurality of element main bodies 32 at the same time.

As shown in FIG. 9, the closing plate 56 is pressed by the pressing plate 57. Thereby, each projection 65 of the pressing plate 57 causes the closing plate 56 to elastically deform into the slots 61 to 63, particularly into the cavities 64. As a result, the electrically conductive paste 53 filled in the slits 61 to 63 is supplied to flow onto the first main surface 59 of the slit plate 55. Therefore, the electrically conductive paste 53 in the slits 61 to 63 will be applied to the first side surface 35 of each element main body 32 with a desired width. At this moment, the electrically conductive paste 53 may be applied not only to the first side surface 35 of the element main body 32, but also to other surfaces adjacent to the first side surface 35 so as to be extended, i.e., part of the second side surface 36 and part of the fourth side surface 38, further to part of the first end surface 33 and part of the second end surface 34.

In this manner, after the electrically conductive paste 53 has been applied to the first side surface 35 of each element main body 32, a drying treatment is carried out to dry the applied paste. Subsequently, similar treatments are carried out successively on the second to fourth side surfaces 36 to 38.

After that, the electrically conductive paste 53 applied to each element main body 32 is subjected to a sintering treatment, thereby forming the desired first external electrode 39, the second external electrode 40 and the third external electrode 41 on each element main body.

As described above, when the electrically conductive paste 53 fills the slits 61 to 63 and the cavities 64, it is preferred to carry out the following operations.

First, the closing plate 56 is pressed by the pressing plate 57 so that the closing plate 56 is caused to elastically deform towards the cavities 64. This state is maintained before filling the conductive paste. Further, this state is equivalent to that after the electrically conductive paste 53 is applied to the element main body 32, the position of the pressing plate 57 is kept unchanged, while the element main bodies 32 are separated from the slit plate 55.

Next, under the above-described condition, the electrically conductive paste 53 is applied to the first main surface 59 of the slit plate 55 so as to cover the slits 61 to 63. In the process of applying the electrically conductive paste 53, a tool called a squeezer may be used. It is preferred that the electrically conductive paste 53 is applied with a desired thickness to the first main surface 59 of the slit plate 55, by moving the squeezer in a direction that is substantially parallel to the first main surface 59 of the slit plate 55.

Then, the pressing force applied on the closing plate 56 by the pressing plate 57 is released, so that the elastic deformation of the closing plate 56 is restored. According to this operation, the electrically conductive paste 53 fills the slits 61 to 63 and the cavities 64.

Subsequently, by operating the squeezer on the first main surface 59, an extra amount of the electrically conductive paste 53 remaining on the first main surface 59 is removed. At this time, the squeezer can be used to press the electrically conductive paste 53 into the slits 61 to 63.

In this manner, filling and supplying the electrically conductive paste 53 into the slits 61 to 63 and the cavities 64 is performed. When it is required to repeatedly apply the electrically conductive paste 53 to the element main bodies 32, the filling and supplying process, and the applying process of the conductive paste are performed alternately and repeatedly.

Although it has been described above that in the paste applying apparatus 54, a plurality of cavities 64 each defining relatively large internal spaces are provided in the slit plate 55 such that the slits 61 to 63 are connected with one another, this type of cavities are not absolutely necessary and may be omitted.

Figure 10:
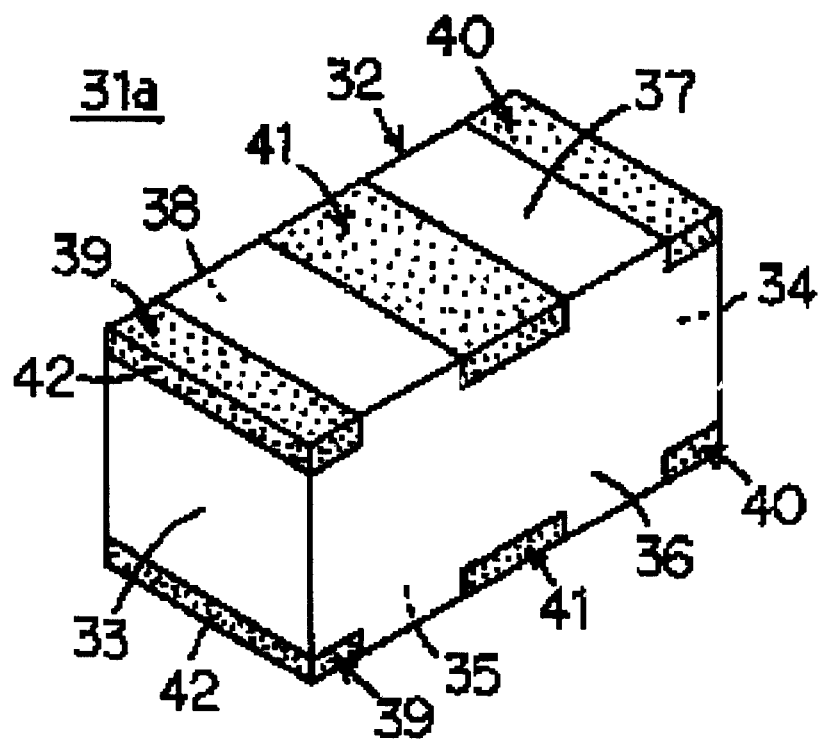
FIG. 10 is a perspective view schematically showing an outer appearance of a chip-like electronic component made according to another preferred embodiment of the present invention.
Figure 11:
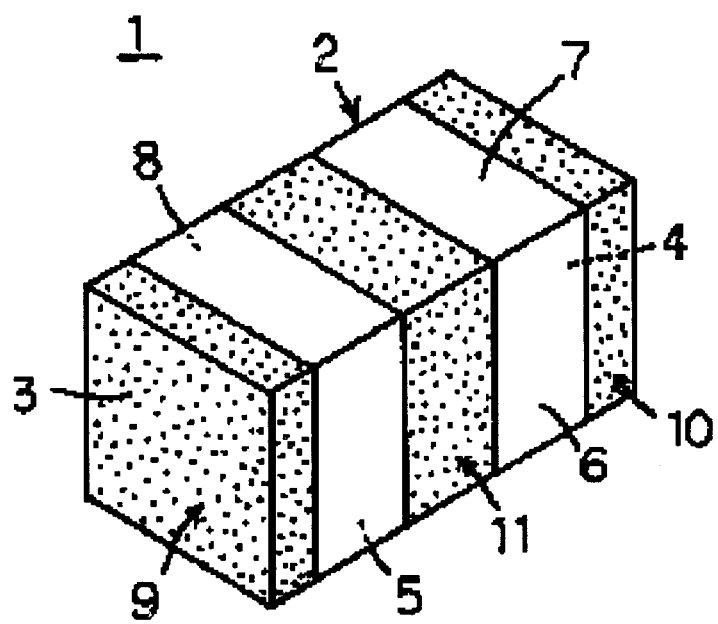
FIG. 11 is a perspective view schematically showing an outer appearance of a chip-like electronic component made according to a conventional method.
Figure 12:
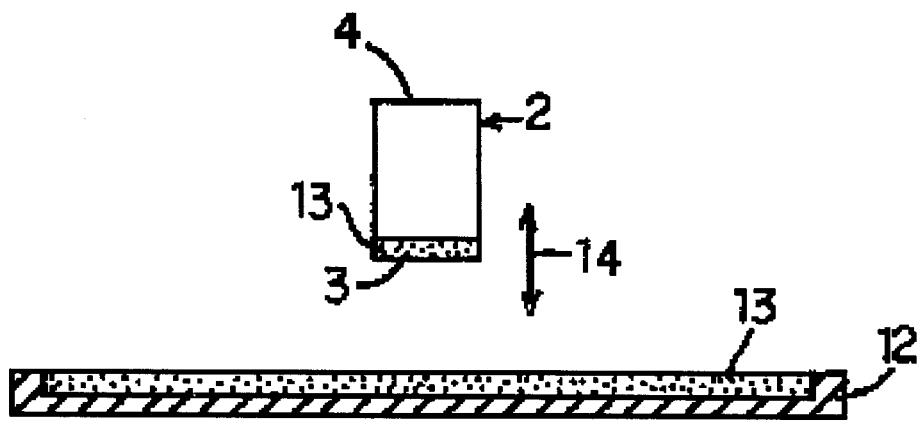
FIG. 12 is a cross-sectional view schematically showing a paste application apparatus for applying an electrically conductive paste in order to form a first external electrode and a second external electrode shown in FIG. 11.

FIG. 10 is a perspective view schematically showing an outer appearance of a chip-like electronic component 32a made according to a further preferred embodiment of the present invention. As may be seen in FIG. 10, because many elements of the chip-like electronic component 31a are common with those defining the chip-like electronic component 31 shown in FIG. 1, similar elements defining the chip-like electronic component in FIG. 10 will be represented by the same reference numerals as used in FIG. 1, and the corresponding explanations thereof are omitted here.

In the chip-like electronic component 31a shown in FIG. 10, a first external electrode 39, a second external electrode 40 and a third external electrode 41, are arranged to extend on the outer surface of the element main body 32, including portions provided on a first side surface 35 and a third side surface 37, portions provided on a second side surface 36 and a fourth side surface 38, and portions provided on a first end surface 33 and a second end surface 34, which are adjacent to the first and third side surfaces 35 and 37.

In a process of forming the external electrodes 39 to 41 of the chip-like electronic component 31a, the operation of applying the electrically conductive paste 53 is performed only to the first side surface 35 and the third side surface 37, in the same manner as shown in FIG. 8 and FIG. 9.

Further, with regard to the preferred embodiment shown in FIG. 10, the first external electrode 39, the second external electrode 40 and the third external electrode 41 may also not provided on the third side surface 37, but rather provided only on the first side surface 35 and part of its adjacent surfaces.

Although the present invention has been described with reference to several preferred embodiments shown in the accompanying drawings, the present invention should not be limited to these described preferred embodiments. The scope of the present invention may also include some other preferred embodiments.

For example, as long as the third external electrode 41 used in the above preferred embodiments shown in the accompanying drawings is disposed between the first external electrode 39 and the second external electrode 40, the position and the number and the width of the third external electrode 41 may vary to any appropriate extent.

Further, in the process of applying the electrically conductive paste 53 in a manner shown in FIG. 8 and FIG. 9, although each element main body 32 is in contact with the first main surface 59 of the slit plate 55, each element main body may float slightly above the first main surface.

Figure 13:
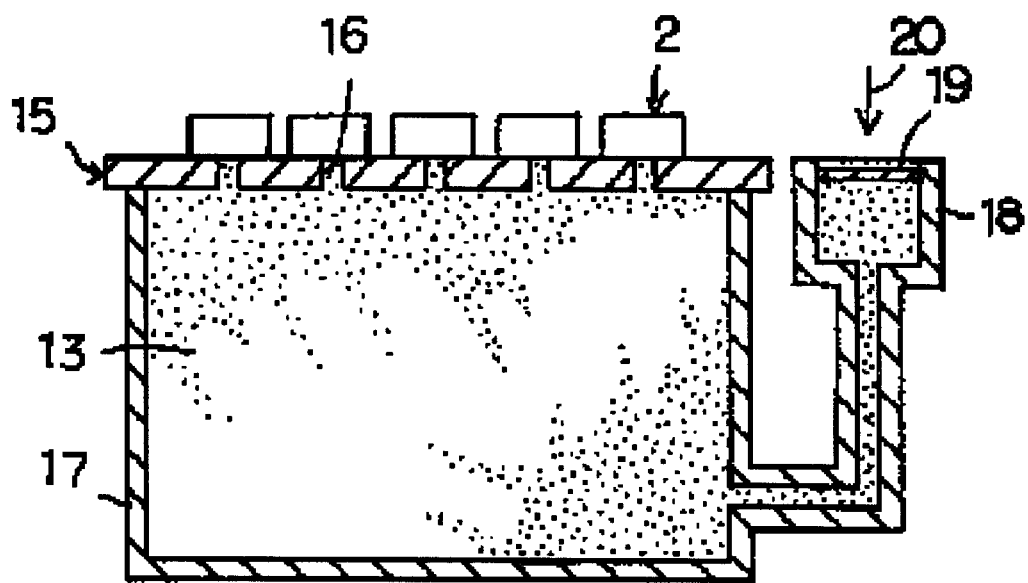
FIG. 13 is a cross-sectional view schematically showing a paste application apparatus for applying an electrically conductive paste in order to form a third external electrode shown in FIG. 1.
Figure 14:
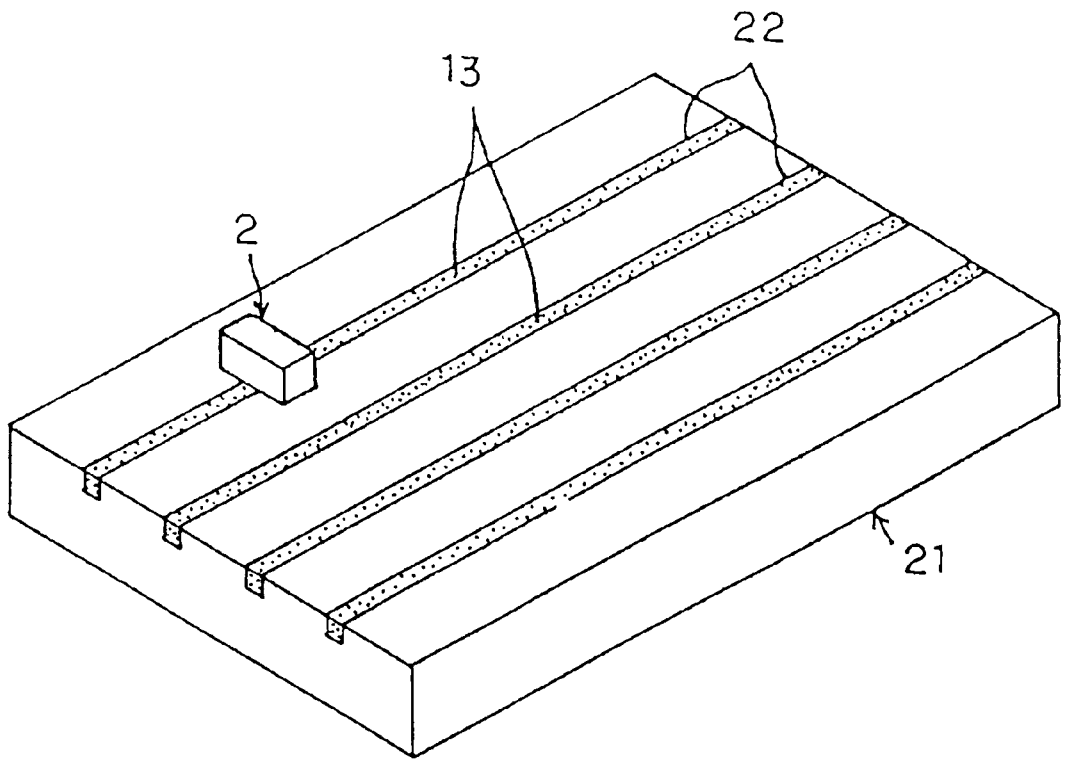
FIG. 14 is a perspective view schematically showing another paste application apparatus for applying an electrically conductive paste in order to form a third external electrode shown in FIG. 11.

Moreover, the application of the electrically conductive paste 53 is not limited to the paste application apparatus 54 shown in FIG. 8 and FIG. 9. The apparatus shown in FIG. 13 or the apparatus shown in FIG. 14 may also be used. If the apparatus shown in FIG. 13 is used, the slit plate 15 will be provided with a plurality of slits that are the same as the first slits 61, the second slits 62 and the third slits 63 as shown in FIG. 8. On the other hand, if the apparatus shown in FIG. 14 is used, the paste applying plate 21 will similarly be provided with a plurality of slits, having the same width and with the same interval as the first slits 61, the second slits 62 and the third slits 63.

As described in the above, according to the chip-like electronic component of various preferred embodiments of the present invention, the external electrodes are provided on at least the first side surface, the external electrodes including a first external electrode provided on the first end surface side, a second external electrode provided on the second end surface side, a third external electrode provided between the first external electrode and the second external electrode. In particular, the first external electrode, the second external electrode and the third external electrode are provided to extend to other surfaces adjacent to the first side surface, the first external electrode and the second external electrode are provided such that the first end surface and the second end surface are exposed at least at the approximate central portions thereof.

For the above reason, when manufacturing a chip-like electronic component as described above, a slit plate is used which has first, second and third slits capable of passing an electrically conductive paste so as to apply the paste to any of the side surfaces of each element main body to form a first external electrode, a second external electrode and a third external electrode on each element main body. Thus, the electrically conductive paste is applied through the first, second and third slits to the first main surface of the slit plate, so as to apply the electrically conductive paste to a desired side surface of an element main body. In this way, several portions of the electrically conductive paste for forming the first, second and third external electrodes may be applied at the same time. Therefore, some steps which are otherwise necessary in applying the electrically conductive paste to the first end surface and the second end surface of an element main body are eliminated. Accordingly, the number of necessary steps required for the application of the electrically conductive paste is substantially reduced. As a result, the production cost of manufacturing the chip-like electronic component is greatly reduced.

The chip-like electronic component according to preferred embodiments of the present invention is an LC composite electronic component which is arranged such that the chip-like element main body includes a first inductor and a second inductor which are connected in series with each other between the first external electrode and the second external electrode, further includes a capacitor including one capacitor electrode connected to the third external electrode and another capacitor electrode connected to a middle point between the first inductor and the second inductor. Further, the chip-like element main body has a laminated structure including a plurality of electrically insulating layers laminated in the longitudinal direction of the element main body so as to effect a connection between the first end surface and the second end surface. The first inductor is disposed in the vicinity of the first end surface, occupying one third of the chip-like element main body in the longitudinal direction, the second inductor is disposed in the vicinity of the second end surface, the capacitor is disposed in a middle portion of the chip-like element main body. The first inductor and the second inductor are provided by coil conductors arranged among the electrically insulating layers such that the two inductors are extending in coiled configuration with their axial directions being coincident with the longitudinal direction of the chip-like element main body, the first inductor and the second inductor are also provided by a via-hole conductor arranged through the electrically insulating layers. The capacitor electrodes of the capacitor are provided among the electrically insulating layers. If a chip-like electronic component is an LC composite electronic component, a magnetic field generated by the inductors will not be blocked by the first external electrode and the second external electrode, thereby improving a desired inductance.

In addition, when manufacturing a chip-like electronic component according to preferred embodiments of the present invention, a closing plate is disposed which is made of an elastomer capable of contacting the second main surface of the slit plate so as to close the first, second and third slits. Further, a pressing plate is provided to press the closing plate so as to cause the closing plate to elastically deform towards the first, second and third slits, thereby filling the first, second and third slits with the electrically conductive paste. After the first, second and third slits have been filled with the electrically conductive paste, the closing plate is pressed by the pressing plate, so as to cause the closing plate to elastically deform towards the first, second and third slits, thereby causing the electrically conductive paste filled in the first, second and third slits to flow on to the first main surface of the slit plate, and thus enabling the electrically conductive paste in the first, second and third slits to be applied to the predetermined side surfaces of the element main body. In this way, an amount of the electrically conductive paste to be supplied to the first main surface of the slit plate, and an amount of pressing the closing plate with the use of the pressing plate, will depend upon a deforming amount of the closing plate when it is deformed towards the first, second and third slits. Accordingly, a uniform application of the electrically conductive paste is ensured when applying the electrically conductive paste to a plurality of electronic component main bodies.

Therefore, when the electrically conductive paste filled in the slits is applied to each element main body, the areas for applying the electrically conductive paste is accurately controlled such that the paste can extend to part of surfaces adjacent to a specific side surface of an element main body.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A chip-like electronic component comprising:
    an element main body including a first end surface and a second end surface on opposite ends of said element main body, a first side surface, a second side surface, a third side surface and a fourth side surface, all of which are arranged so as to connect between the first end surface and the second end surface;
    external electrodes provided on an outer surface of the element main body; wherein
        the external electrodes are provided on at least the first side surface, the external electrodes including a first external electrode provided on the element main body at the first end surface, a second external electrode provided on the element body at the second end surface, a third external electrode provided between the first external electrode and the second external electrode;
        the first external electrode, the second external electrode and the third external electrode are arranged to extend to other surfaces adjacent to the first side surface, the first external electrode extends only partially over the first end surface and the second external electrode extends only partially over the second end surface such that the first end surface and the second end surface are exposed at least at approximate central portions thereof;
        the element main body includes a first inductor and a second inductor which are connected in series with each other between the first external electrode and the second external electrode, and a capacitor including one capacitor electrode connected to the third external electrode and another capacitor electrode connected to an approximate middle point between the first inductor and the second inductor; and
        the element main body has a laminated structure including a plurality of electrically insulating layers laminated in the longitudinal direction of the element main body so as to connect between the first end surface and the second end surface, the first inductor is located in the vicinity of the first end surface, which is disposed in a one third portion of the element main body in the longitudinal direction, the second inductor is located in the vicinity of the second end surface, the capacitor is located in a middle portion of the element main body, the first inductor and the second inductor are defined by coil conductors arranged among the electrically insulating layers and via-hole conductors arranged through the electrically insulating layers, such that the two inductors are extending in coiled configuration with the axial directions thereof being coincident with the longitudinal direction of the element main body, the capacitor electrodes constituting the capacitor are provided among the electrically insulating layers.

2. The chip-like electronic component according to claim 1, wherein the first external electrode, the second external electrode and the third external electrode include portions provided on the third side surface opposite to the first side surface and portions extended to other surfaces adjacent to the third side surface.

3. The chip-like electronic component according to claim 2, wherein the first external electrode, the second external electrode and the third external electrode include portions provided on the second side surface and the fourth side surface, such that the first external electrode, the second external electrode and the third external electrode extend around the first side surface, the second side surface, the third side surface and the fourth side surface, and such that the first external electrode and the second external electrode extend to edge portions of the first end surface and the second end surface.

4. The chip-like electronic component according to claim 1, wherein said external electrodes are provided separately on at least the first side surface and the third side surface opposite to the first side surface, respectively, said first, second and third external electrodes are arranged to extend to other side surfaces adjacent to the first and third side surfaces, said first and second inductors are connected to the first and second external electrodes via first and second leading conductors, respectively, said first and second leading conductors being located in the vicinity of the first and second end surfaces of the element main body, and said first and second leading conductors extend to peripheral edges of the insulating layers such that said first and second leading conductors are connected to the first and second external electrodes and define windows at central portions of the insulating layers.

5. A method of manufacturing a chip-like electronic component, said method comprising the steps of:

preparing a plurality of element main bodies;

preparing a slit plate having a first main surface and a second main surface which are opposite to each other with a predetermined interval between them, and having first, second and third slits to pass an electrically conductive paste to apply the paste to any of the side surfaces of each of the element main bodies to form a first external electrode, a second external electrode and a third external electrode on each element main body, the application of the paste being performed under a condition in which each of the element main bodies has been placed on to the slit plate such that any one of the first to fourth side surfaces of the element main body is caused to surface the first main surface of the slit plate;

placing each of the element main bodies on the first main surface of the slit plate such that any one of the side surfaces of each of the element main bodies faces the first main surface of the slit plate;

supplying the electrically conductive paste through the first, second and third slits to the first main surface of the slit plate, so as to apply the electrically conductive paste to any one of the side surfaces of the plurality of element main bodies.

6. The method of manufacturing a chip-like electronic component according to claim 5, wherein the step of preparing the slit plate includes placing a closing plate including a resilient member capable of contacting the second main surface of the slit plate so as to close the first, second and third slits, preparing a pressing plate capable of pressing the closing plate so as to cause the closing plate to elastically deform towards the first, second and third slits, filling the first, second and third slits with the electrically conductive paste, wherein the step of applying the electrically conductive paste includes pressing the closing plate by the pressing plate, so as to cause the closing plate to elastically deform towards the first, second and third slits, thereby causing the electrically conductive paste filled in the first, second and third slits to swell onto the first main surface of the slit plate, and thus enabling the electrically conductive paste in the first, second and third slits to be applied to any one of the side surfaces of the element main bodies.

7. A method of manufacturing a chip-like electronic component according to claim 5, further including the step of providing said element main bodies with a first end surface and a second end surface on opposite ends of said chip-like element main body, a first side surface, a second side surface, a third side surface and a fourth side surface, all of which are arranged so as to connect between the first end surface and the second end surface.

8. A method of manufacturing a chip-like electronic component according to claim 5, wherein the first external electrode, the second external electrode and the third external electrode are formed to extend to other surfaces adjacent to the first side surface, the first external electrode and the second external electrode are configured such that the first end surface and the second end surface are exposed at least at approximate central portions thereof.

9. A method of manufacturing a chip-like electronic component according to claim 8, wherein the first external electrode, the second external electrode and the third external electrode include portions provided on the third side surface opposite to the first side surface and portions extended to other surfaces adjacent to the third side surface.

10. A method of manufacturing a chip-like electronic component according to claim 8, wherein the first external electrode, the second external electrode and the third external electrode include portions provided on the second side surface and the fourth side surface, such that the first external electrode, the second external electrode and the third external electrode extend around the first side surface, the second side surface, the third side surface and the fourth side surface, and such that the first external electrode and the second external electrode are configured to extend to edge portions of the first end surface and the second end surface.

11. A method of manufacturing a chip-like electronic component according to claim 8, wherein the chip-like element main bodies include a first inductor and a second inductor which are connected in series with each other between the first external electrode and the second external electrode, and a capacitor including one capacitor electrode connected to the third external electrode and another capacitor electrode connected to an approximate middle point between the first inductor and the second inductor.

12. A method of manufacturing a chip-like electronic component according to claim 8, wherein the chip-like element main body has a laminated structure including a plurality of electrically insulating layers laminated in the longitudinal direction of the element main body so as to connect between the first end surface and the second end surface, the first inductor is located in the vicinity of the first end surface, which is disposed in a one third portion of the chip-like element main body in the longitudinal direction, the second inductor is located in the vicinity of the second end surface, the capacitor is located in a middle portion of the chip-like element main body, the first inductor and the second inductor are formed by coil conductors arranged among the electrically insulating layers and via-hole conductors arranged through the electrically insulating layers, such that the two inductors extend in a coiled configuration with the axial directions thereof being coincident with the longitudinal direction of the chip-like element main body, the capacitor electrodes constituting the capacitor are provided among the electrically insulating layers.

13. A method of manufacturing a chip-like electronic component according to claim 5, wherein the slit plate is prepared as a single integral structure.

14. A method of manufacturing a chip-like electronic component according to claim 5, wherein the slit plate is prepared as a two-part structure.

15. A method of manufacturing a chip-like electronic component according to claim 5, wherein the slit plate is made of stainless steel.

* * * * *